(12) United States Patent
Kim et al.

(10) Patent No.: US 9,276,133 B2
(45) Date of Patent: Mar. 1, 2016

(54) VERTICAL MEMORY DEVICES AND METHOD OF MANUFACTURING THE SAME

(71) Applicant: Samsung Electronics Co., Ltd., Suwon-si (KR)

(72) Inventors: Jung-Hwan Kim, Seoul (KR); Jun-Kyu Yang, Seoul (KR); Hun-Hyeong Lim, Hwaseong-si (KR); Jae-ho Choi, Busan (KR); Ki-Hyun Hwang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/184,262

(22) Filed: Feb. 19, 2014

(65) Prior Publication Data

US 2014/0332875 A1 Nov. 13, 2014

(30) Foreign Application Priority Data

May 13, 2013 (KR) .......................... 10-2013-0053509

(51) Int. Cl.
*H01L 27/115* (2006.01)
*H01L 29/792* (2006.01)
*H01L 29/66* (2006.01)
*H01L 21/28* (2006.01)

(52) U.S. Cl.
CPC ...... *H01L 29/7926* (2013.01); *H01L 27/11582* (2013.01); *H01L 29/66833* (2013.01); *H01L 21/28282* (2013.01)

(58) Field of Classification Search
USPC .......................................... 257/324; 438/268
See application file for complete search history.

(56) References Cited

U.S. PATENT DOCUMENTS

| 7,884,417 | B2 | 2/2011 | Mizukami et al. |
| 8,013,389 | B2 | 9/2011 | Oh et al. |
| 8,084,805 | B2 | 12/2011 | Shim et al. |
| 8,207,029 | B2 | 6/2012 | Ishikawa et al. |
| 2011/0018052 | A1 | 1/2011 | Fujiwara et al. |
| 2011/0024816 | A1 | 2/2011 | Moon et al. |
| 2011/0049607 | A1 | 3/2011 | Yahashi |
| 2011/0298037 | A1* | 12/2011 | Choe et al. ............... 257/324 |
| 2012/0156848 | A1* | 6/2012 | Yang ............ H01L 27/11529 438/287 |
| 2012/0211819 | A1 | 8/2012 | Alsmeier |
| 2012/0211821 | A1 | 8/2012 | Matsumoto |
| 2013/0134492 | A1* | 5/2013 | Yang ............ H01L 27/11582 257/314 |

FOREIGN PATENT DOCUMENTS

| KR | 20110001592 A | 1/2011 |
| KR | 20110107985 A | 10/2011 |

* cited by examiner

*Primary Examiner* — Zandra Smith
*Assistant Examiner* — Lawrence Tynes, Jr.
(74) *Attorney, Agent, or Firm* — Onello & Mello LLP

(57) ABSTRACT

A method of manufacturing a vertical memory device is disclosed. In the method, a plurality of insulation layers and a plurality of first sacrificial layers are alternately stacked on a substrate. A plurality of holes is formed through the plurality of insulation layers and first sacrificial layers. A plasma treatment process is performed to oxidize the first sacrificial layers exposed by the holes. A plurality of second sacrificial layer patterns project from sidewalls of the holes. A blocking layer pattern, a charge storage layer pattern and a tunnel insulation layer pattern are formed on the sidewall of the holes that cover the second sacrificial layer patterns. A plurality of channels is formed to fill the holes. The first sacrificial layers and the second sacrificial layer patterns are removed to form a plurality of gaps exposing a sidewall of the blocking layer pattern. A plurality of gate electrodes is formed to fill the gaps.

16 Claims, 19 Drawing Sheets

VERTICAL MEMORY DEVICES AND METHOD OF MANUFACTURING THE SAME

CROSS-REFERENCE TO RELATED APPLICATION

This application claims priority under 35 USC §119 to Korean Patent Application No. 10-2013-0053509, filed on May 13, 2013 in the Korean Intellectual Property Office (KIPO), the contents of which are herein incorporated by reference in their entirety.

BACKGROUND

1. Field

Example embodiments relate to memory devices and methods of manufacturing the same. More particularly, example embodiments relate to vertical memory devices having a vertical channel and methods of manufacturing the same.

2. Description of the Related Art

During the manufacturing of a vertical memory device, an insulation layer and a sacrificial layer may be alternately and repeatedly formed on a substrate. Holes are formed though the insulation layers and the sacrificial layers. Channels are formed in the holes. Openings are likewise formed through the insulation layers and the sacrificial layers. The sacrificial layers exposed by the openings are removed to form gaps that expose the channels. Oxide-nitride-oxide (ONO) layers and gate structures including gate electrodes are formed in the gaps.

The holes typically have a width that becomes gradually smaller from a top portion to a bottom portion thereof, due to the characteristics of an etch process. Therefore, memory cells disposed at the top portion and the bottom portion of the hole, respectively, may have different sizes and different electrical characteristics.

SUMMARY

Example embodiments provide a vertical memory device capable of improving a dispersion of an electrical characteristic.

Other example embodiments provide a method of manufacturing the vertical memory device capable of improving a dispersion of an electrical characteristic.

According to example embodiments, there is provided a method of manufacturing a vertical memory device. In the method, a plurality of insulation layers and a plurality of first sacrificial layers are alternately stacked on a substrate. A plurality of holes is formed through the plurality of insulation layers and first sacrificial layers. A plasma treatment process is performed to oxidize the first sacrificial layers exposed by the holes. A plurality of second sacrificial layer patterns are formed projecting from sidewalls of the holes in response to performing the plasma treatment process. A blocking layer pattern, a charge storage layer pattern and a tunnel insulation layer pattern are formed on the sidewall of the holes that cover the second sacrificial layer patterns. A plurality of channels is formed to fill the holes. The first sacrificial layers and the second sacrificial layer patterns are removed to form a plurality of gaps exposing a sidewall of the blocking layer pattern. A plurality of gate electrodes is formed to fill the gaps.

In example embodiments, the portions of the second sacrificial layer patterns extending from the sidewalls of the holes may have different widths relative to each other.

In example embodiments, the widths of the second sacrificial layer pattern portions may become gradually smaller from a top portion to a bottom portion of the holes.

In example embodiments, a ratio between a first width of the second sacrificial layer pattern closest to the substrate and a second width of the second sacrificial layer pattern farmost from the substrate may be smaller than about 1/5.

In example embodiments, the plasma treatment process may use an oxygen gas, a nitrogen oxide gas, a nitrous oxide gas, an ozone gas, a water gas or a mixture thereof.

In example embodiments, the plasma treatment process may be performed at a pressure below about 1 Torr.

In example embodiments, a semiconductor pattern may be further formed to partially fill the holes, before performing the plasma treatment process.

In example embodiments, a preliminary semiconductor pattern may be further formed that at least partially fills the holes, before performing the plasma treatment process. The preliminary semiconductor pattern may be partially removed to form a semiconductor pattern, after performing the plasma treatment process.

According to example embodiments, there is provided a method of manufacturing a vertical memory device. In the method, a plurality of insulation layers and a plurality of first sacrificial layers are alternately stacked on a substrate. The insulation layers and the first sacrificial layers are partially removed to form a plurality of preliminary holes. A plasma treatment process is performed to oxidize the first sacrificial layers exposed by the preliminary holes. A plurality of second sacrificial layer patterns formed projecting from sidewalls of the preliminary holes in response to performing the plasma treatment process. The insulation layers and the first sacrificial layers under the preliminary holes are partially removed to form a plurality of holes. A blocking layer pattern, a charge storage layer pattern and a tunnel insulation layer pattern are formed on the sidewall of the holes that cover the second sacrificial layer patterns. A plurality of channels is formed to fill the holes. The first sacrificial layer and the second sacrificial layer patterns are removed to form a plurality of gaps exposing a sidewall of the blocking layer pattern. A plurality of gate electrodes is formed to fill the gaps.

In example embodiments, the widths of the second sacrificial layer patterns may become gradually smaller from a top portion to a bottom portion of the preliminary holes.

In example embodiments, a ratio between a first width of the second sacrificial layer pattern closest to the substrate and a second width of the second sacrificial layer pattern farmost from the substrate may be smaller than about 1/5.

According to example embodiments, there is provided a vertical memory device including a plurality of channels, a plurality of charge storage structures and a plurality of gate electrodes. The plurality of channels is arranged in a second direction substantially parallel to a top surface of a substrate. Each of the channels extends in a first direction substantially perpendicular to the top surface of the substrate. The plurality of charge storage structures is disposed on sidewalls of each channel. Each of the charge storage structure includes a tunnel insulation layer pattern, a charge storage layer pattern and a blocking layer pattern. A plurality of gate electrodes is arranged on a sidewall of the charge storage structure. The charge storage structure has a curved sidewall including a plurality of convex portions and a plurality of concave portions that are arranged alternately and repeatedly in the first direction. The gate electrodes contact the concave portions.

In example embodiments, heights of the convex portions may become gradually larger in a direction extending from the substrate.

In example embodiments, a ratio between a first height of the convex portion closest to the substrate and a second height of the convex portion farmost from the substrate may be smaller than about 1/5.

In example embodiments, the gate electrodes may include ground selection lines, word lines and string selection lines that are spaced apart from each other along the first direction.

According to example embodiments, there is provided a method of forming a vertical memory device. In the method, a plurality of insulation layers and a plurality of first sacrificial layers are, comprising alternately stacked on a substrate. A plurality of holes are formed through the plurality of insulation layers and first sacrificial layers. A plurality of second sacrificial layer patterns are formed. Portions of the second sacrificial layer patterns project from sidewalls of the holes. A charge storing structure is formed at the holes. The first sacrificial layers and the second sacrificial layer patterns are removed to form a plurality of gaps exposing a sidewall of the charge storing structure. A plurality of gate electrodes are formed to fill the gaps. A variation of widths of the holes are offset by widths of the portions of the second sacrificial layer pattern projecting the sidewalls of the holes.

In example embodiments, forming the second sacrificial layer patterns comprises performing a plasma treatment process to oxidize the first sacrificial layers exposed by the holes.

In example embodiments, portions of the second sacrificial layer patterns extending from the sidewalls of the holes have different widths relative to each other.

In example embodiments, the widths of the second sacrificial layer pattern portions become gradually smaller from a top portion to a bottom portion of the holes.

In example embodiments, a ratio between a first width of the second sacrificial layer pattern closest to the substrate and a second width of the second sacrificial layer pattern farmost from the substrate is smaller than about 1/5.

According to example embodiments, a plasma treatment process having a relatively low step coverage may be performed to form second sacrificial layer patterns. Dimensions of the second sacrificial layer patterns from the sidewalls of holes may become gradually smaller from a top portion to a bottom portion of the holes. Widths of the holes may become gradually smaller from the top portion to the bottom portion of the holes. Therefore, a variation of the widths of the holes may be offset by the widths of the second sacrificial layer pattern. Accordingly, the gate electrodes may have substantially the same size and the same electrical characteristic.

BRIEF DESCRIPTION OF THE DRAWINGS

Example embodiments will be more clearly understood from the following detailed description taken in conjunction with the accompanying drawings. The drawings herein represent non-limiting, example embodiments as described herein.

DETAILED DESCRIPTION

Figure 1:
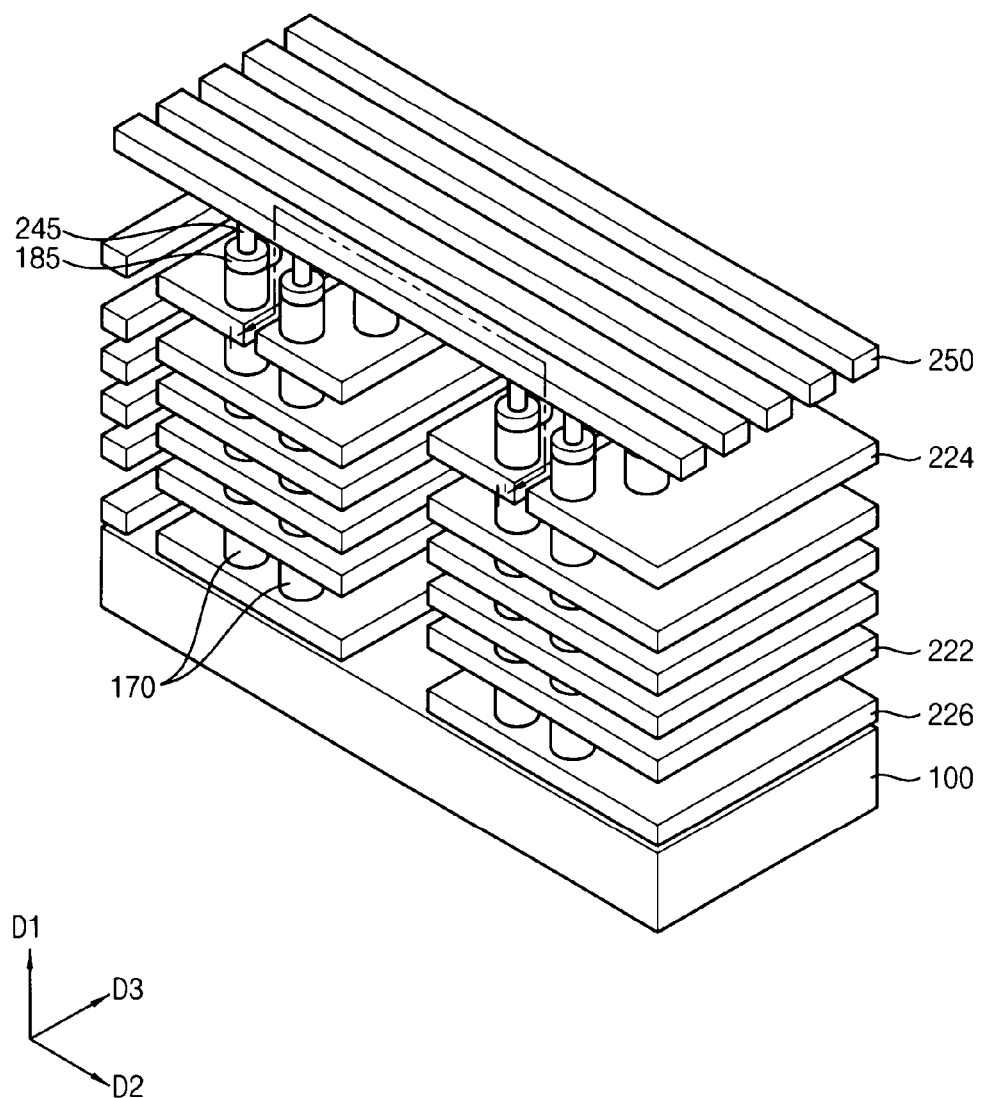
FIG. 1 is a perspective illustrative view of a vertical memory device in accordance with example embodiments.

Example embodiments will now be described more fully with reference to the accompanying drawings, in which example embodiments are shown. Example embodiments may, however, be embodied in many different forms and should not be construed as limited to the example embodiments set forth herein. In the drawings, the thicknesses of layers and regions are exaggerated for clarity. Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In brief overview, devices, systems, and methods are described, whereby, after forming holes, a plasma treatment process can be performed to oxide a sacrificial layer. The oxidized sacrificial layer may project from a sidewall of the hole so that a variation of a width of the hole is offset by a width of the portion of the oxidized sacrificial layer extending from the sidewall of the hole.

Figure 2:
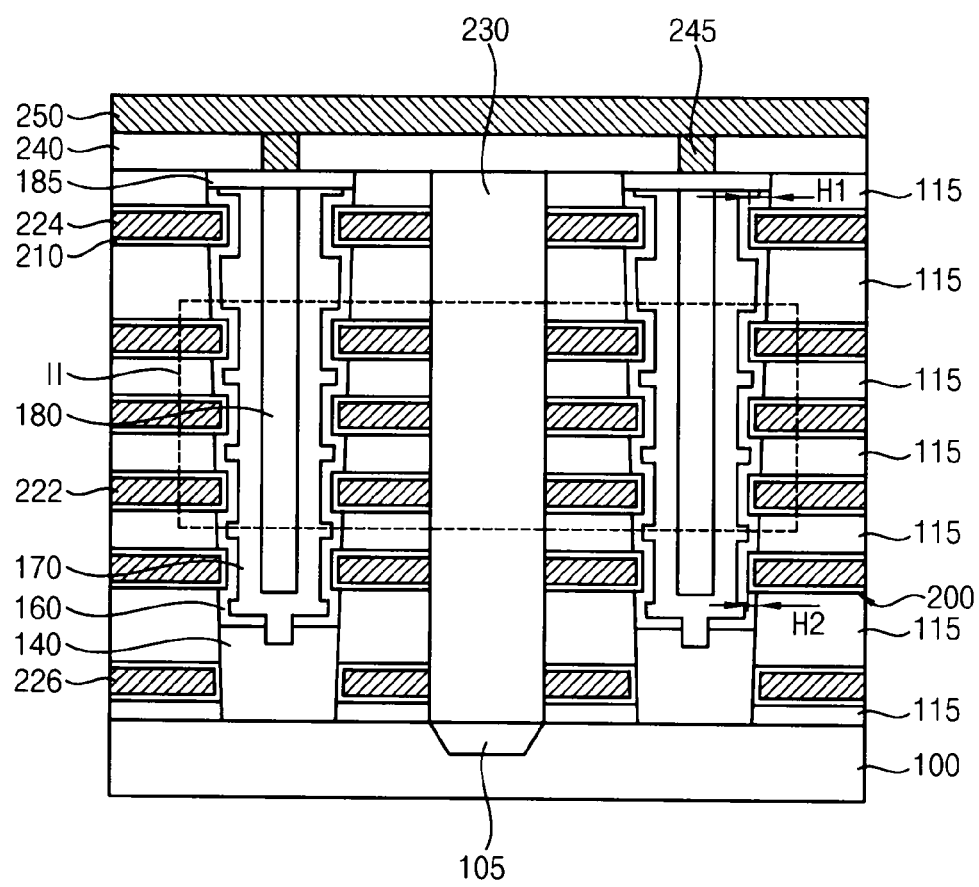
FIG. 2 is a cross-sectional view of the vertical memory device of FIG. 1 cut along the line I-I' in FIG. 1.
Figure 3:
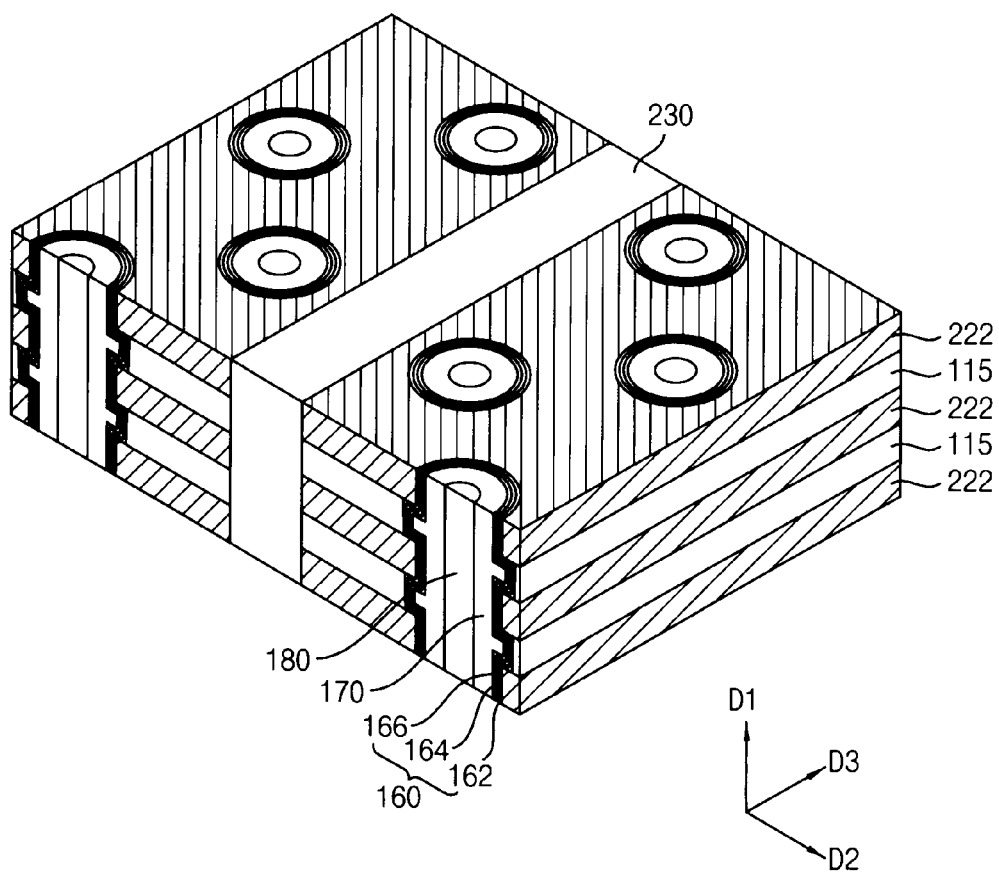
FIG. 3 is a local perspective illustrative view of the vertical memory device of FIGS. 1 and 2.

FIG. 1 is a perspective illustrative view of a vertical memory device in accordance with example embodiments. FIG. 2 is a cross-sectional view of the vertical memory device of FIG. 1 cut along the line I-I' in FIG. 1. FIG. 3 is a local perspective illustrative view of the vertical memory device of FIGS. 1 and 2.

For the convenience of brevity with respect to the explanation, FIGS. 1-3 do not show all elements of a vertical memory device, but only shows some relevant elements thereof, e.g., a substrate, a channel, a gate electrode, a pad, a bit line contact and a bit line. In all figures in this specification, a direction substantially perpendicular to a top surface of the substrate is referred to as a first direction D1, and two directions substantially parallel to the top surface of the substrate and substantially perpendicular to each other are referred to as a second direction D2 and a third direction D3, respectively. Additionally, a direction indicated by an arrow in the figures and a reverse direction thereto are considered as the same direction.

Referring to FIGS. 1 to 3, the vertical memory device may include a plurality of channels 170. Each channel 170 may extend along the first direction D1 on a substrate 100. The vertical memory device may further include a charge storage structure 160 surrounding an outer sidewall of each channel 170 and a plurality of gate electrodes 222, 224 and 226 on an outer sidewall of the charge storage structure 160. The vertical memory device may further include a plurality of bit lines 250 which may be electrically connected to the channels 170.

The substrate 100 may include a semiconductor material, e.g., silicon, germanium, etc.

In some example embodiments, each channel 170 may have a cup shape of which a central bottom is opened. In this case, a space defined by an inner wall of each channel 170 may be filled with a second insulation layer pattern 180. In other example embodiments, each channel 170 may have a pillar shape. For example, the channels 170 may include doped or undoped polysilicon or single crystalline silicon.

In example embodiments, the plurality of channels 170 may be constructed and arranged to extend along the second and third directions D2 and D3, and thus a channel array may be defined.

Referring to FIGS. 2 and 3, the charge storage structure 160 may include a tunnel insulation layer pattern 166, a charge storage layer pattern 164 and a first blocking layer pattern 162 sequentially stacked on and at least partially surrounding the outer sidewalls of each channel 170. In example embodiments, a plurality of charge storage structures 160 may be formed. Each charge storage structure 160 may correspond to a channel 170.

In example embodiments, the tunnel insulation layer pattern 166 may include an oxide, e.g., silicon oxide. The charge storage layer pattern 164 may include a nitride, e.g., silicon nitride. The first blocking layer pattern 162 may include an oxide, e.g., silicon oxide.

The charge storage structure 160 may have a circular cup shape having a curved sidewall. The charge storage structure 160 may include a plurality of convex portions and a plurality of concave portions. In example embodiments, the plurality of convex portions and the plurality of concave portions may be constructed and arranged to extend alternately and repeatedly along the first direction D1. The concave portions may include sidewalls that are disposed adjacent a center of the channel 170. A plurality of steps may be disposed between outer sidewalls of the convex portions and outer sidewalls of the concave portions. The widths of the steps, that is, the widths of the convex portions in the second direction D2, may change at each level. For example, a convex portion adjacent a top surface of the substrate 100 may have relatively small height, width, or related dimension, and another convex portion adjacent to the pad 185 may have a relatively large height, width, or related dimension as compared to the convex portion adjacent the top surface of the substrate 100. That is, the heights, widths, or related dimensions of convex portions may become gradually smaller from a top portion to a bottom portion of the charge storage structure 160. In an example embodiment, when a width, height, or related dimension of the convex portion closest to the top surface of the substrate 100 is defined as a second width, height, or related dimension H2, and a width, height, or related dimension of the convex portion farmost from the top surface of the substrate 100 is defined as a first width, height, or related dimension H1, a ratio between the first width, height, or related dimension H1 and the second width, height, or related dimension H2 (H2/H1) may be smaller than about 1/5.

In example embodiments, the outer sidewall of the convex portions may have a different diameter, height, width, surface area, or related dimension at each level, while the outer sidewall of the concave portions may have substantially the same diameter, height, width, surface area, or related dimension at each level. Therefore, a size distribution of the charge storage structure 160 may be improved at the concave portions.

A semiconductor pattern 140 may be disposed between the channel 170 and the substrate 100. A portion of the channel 170 may protrude from a bottom portion of the charge storage structure 160, so that the semiconductor pattern 140 may directly contact the channel 170. In example embodiments, the semiconductor pattern 140 may include doped or undoped polysilicon, single crystalline polysilicon, doped or undoped polygermanium or single crystalline germanium.

Additionally, a pad 185 may be formed on top surfaces of the channel 170 and the charge storage structure 160. In example embodiments, the pad 185 may include doped or undoped polysilicon or single crystalline silicon.

A plurality of first insulation layer patterns 115 may be formed in the first direction D1 on sidewalls of the first blocking layer patterns 162, respectively. That is, the first insulation layer patterns 115 may directly contact the convex portions of the charge storage structure 160. Each first insulation layer pattern 115 may include silicon oxide or related material. A space between first insulation layer patterns 115 at each level extending along the first direction D may be defined as a gap 200.

The second blocking layer pattern 210 may surround a sidewall of the first blocking layer pattern 162 exposed by the gap 200. Thus, portions of the outer sidewalls of the channels 170 may be partially or completely surrounded by the second blocking layer pattern 210. The second blocking layer pattern 210 may be formed on an inner wall of the gap 200. Top and bottom end portions of the second blocking layer pattern 210 may extend in both of the second and third directions D2 and D3. The second blocking layer pattern 210 may include an insulation material, e.g., aluminum oxide and/or silicon oxide.

The plurality of gate electrodes 222, 224 and 226 may be formed on sidewalls of the second blocking layer pattern 210 and may fill the gap 200. That is, at least one or more gate electrodes 222 and 224 may be disposed adjacent to the concave portions of the charge storage structure 160. In example embodiments, the plurality of gate electrodes 222, 224 and 226 may extend in the third direction D3.

The plurality of gate electrodes 222, 224 and 226 may include a ground selection line (GSL) 226, a word line 222 and a string selection line (SSL) 224 that are spaced apart from each other along the first direction D1.

Each of the GSL 226, the word line 222 and the SSL 224 may be at a single level, e.g., each at a different width, or more than one level, and each of the first insulation layer patterns 115 may be interposed therebetween. In an example embodiments, the GSL 226 and the SSL 224 may be at one level, e.g., two of each at different heights, respectively, and the word line 222 may be at multiple levels, for example, four levels, between the GSL 226 and the SSL 217. However, the GSL 226 and the SSL 224 may be at two levels, and the word line 222 may be formed at 2, 8 or 16 levels, or a greater number of levels.

In example embodiments, the plurality of gate electrodes 222, 224 and 226 may include, for example, a metal and/or a metal nitride. For example, the plurality of gate electrodes 222, 224 and 226 may include a metal and/or a metal nitride with low electrical resistance, e.g., tungsten, tungsten nitride, titanium, titanium nitride, tantalum, tantalum nitride and/or platinum.

The plurality of gate electrodes 222, 224 and 226 may be arranged in the second direction D2, and may be separated by the third insulation layer pattern 230 extending in the third direction D3.

Accordingly, the charge storage structure 160 and the plurality of gate electrodes 222, 224 and 226 may define a gate structure. A plurality of gate structures may be formed in the first direction D1.

A bit line 250 may be electrically connected to a pad 185 via one or more bit line contact 245, and thus may be electrically connected to the channels 170. The bit line 250 may include a metal, a metal nitride, doped polysilicon, and the like. In example embodiments, the bit line 250 may extend in the second direction D2. A plurality of bit lines 250 may be formed relative to each other in the third direction D3.

The bit line contact 245 may be disposed through a fourth insulation layer 240, and abut a top surface of the pad 185. The bit line contact 245 may include a metal, a metal nitride, doped polysilicon, and the like.

According to example embodiments, the charge storage structure 160 may have a circular cup shape having the curved sidewall which may include the plurality of convex portions and the plurality of concave portions. The convex portions and the concave portions may be arranged alternately and repeatedly in the first direction D1. The gate electrodes 222 and 224 may directly contact the concave portions of the charge storage structure 160. The charge storage structures 160 may have a uniform size adjacent to the gate electrodes 222 and 224. Accordingly, a dispersion of electrical characteristics of memory cells of the vertical memory devices may be improved.

FIGS. 4 to 13 are cross-sectional views and a perspective view illustrating a method of manufacturing a vertical memory device in accordance with example embodiments. Although the figures show methods of manufacturing the vertical memory device of FIGS. 1 to 3, the method described at FIGS. 4 to 13 are not be limited thereto.

Figure 4:
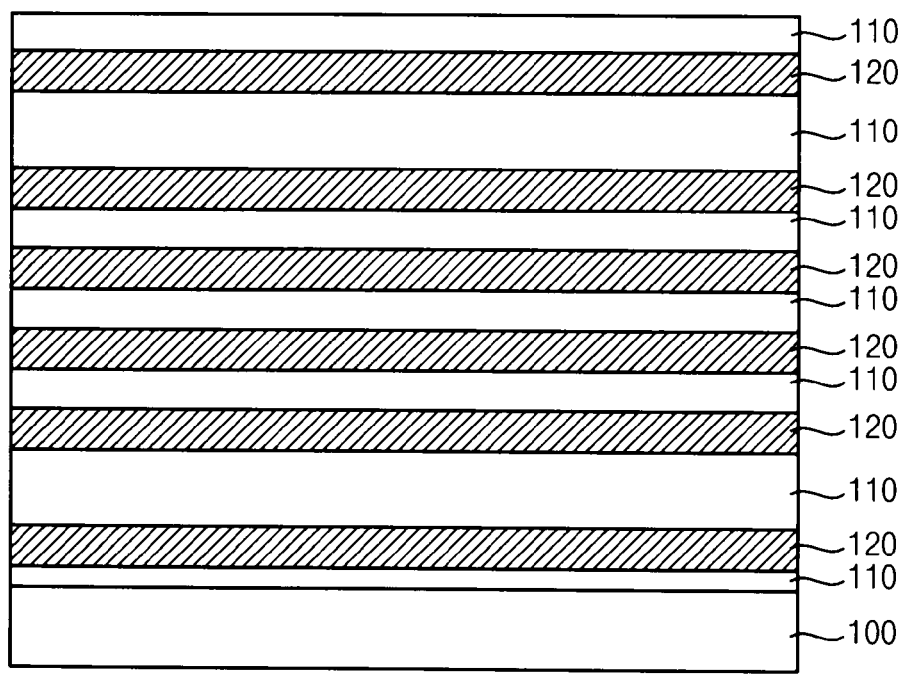
FIGS. 4 to 13 are cross-sectional views and a perspective view illustrating a method of manufacturing a vertical memory device in accordance with example embodiments.
Figure 4:

Referring to FIG. 4, a first insulation layer 110 and a first sacrificial layer 120 may be alternately and repeatedly formed on a substrate 100. Accordingly, a plurality of first insulation layers 110 and a plurality of first sacrificial layers 120 may be alternately formed on each other at a plurality of levels, respectively.

The substrate 100 may include a semiconductor material, for example, silicon and/or germanium.

In example embodiments, the first insulation layers 110 and the first sacrificial layers 120 may be formed by, for example, a chemical vapor deposition (CVD) process, a plasma enhanced chemical vapor deposition (PECVD) process and/or an atomic layer deposition process (ALD) process. A lowermost first insulation layer 110, which may be disposed directly on a top surface of the substrate 100, may be formed by, for example, a thermal oxidation process. In example embodiments, the first insulation layer 110 may be formed to include a silicon oxide. The first sacrificial layer 120 may be formed to include, for example, a material having an etch selectivity with respect to a material of the first insulation layer 110 (e.g., silicon nitride).

Figure 12:
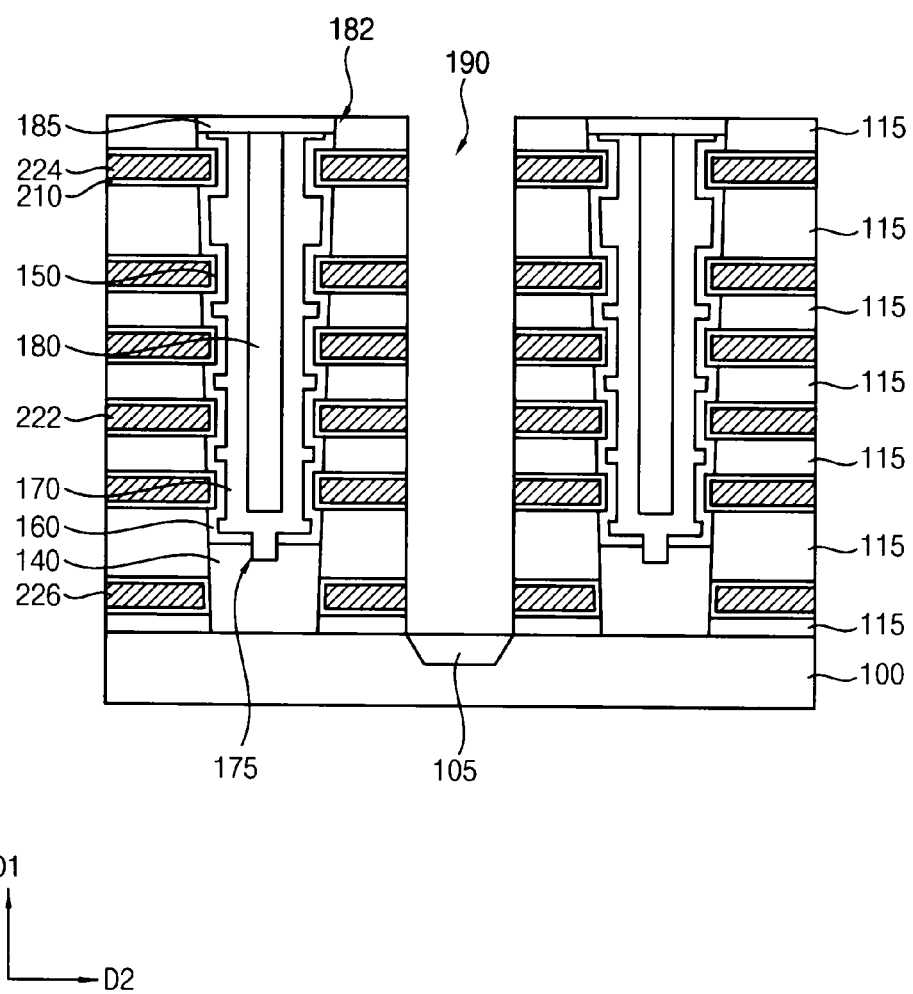

The number of the first insulation layers 110 and the number of the first sacrificial layers 120 stacked on the substrate 100 may vary according to the desired number of a GSL 226, a word line 222 and a SSL 224, for example, shown at FIG. 12. According to at least one example embodiments, each of the GSL 226 and the SSL 224 may be formed at a single level, and the word lines 222 may be formed at multiple levels, for example, four levels. The first sacrificial layers 120 may be formed at multiple levels, for example, six levels, and the first insulation layers 110 may be formed at multiple levels, for example, seven levels. According to at least one example embodiments, each of the GSLs 226 and the SSLs 224 may be formed at two levels, and the word lines 222 may be formed at two, eight, or sixteen levels, or a greater number of levels. The number of the first insulation layers 110 and the number of the first sacrificial layers 120 may vary according to this case. However, the number of GSLs 226, SSLs 224 and word lines 222 may not be limited to the example number of levels referred to herein.

Figure 5:
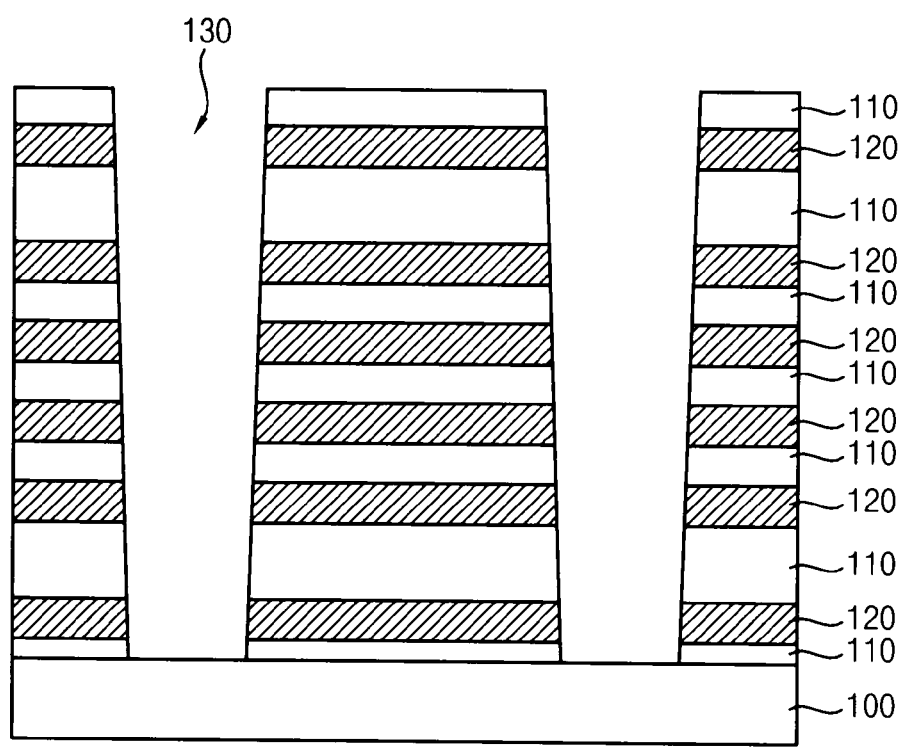
Figure 5:

Referring to FIG. 5, a plurality of holes 130 may be formed through the first insulation layers 110 and the first sacrificial layers 120 to expose the top surface of the substrate 100.

In example embodiments, after forming a hard mask (not shown) on the uppermost first insulation layer 110, the first insulation layers 110 and the first sacrificial layers 120 may be dry etched using the hard mask as an etch mask to form the holes 130. In example embodiments, the hard mask may be formed using a material (e.g., a polysilicon, amorphous polysilicon) having an etch selectivity with respect to the first insulation layer 110 and the first sacrificial layer 120 by a CVD process, a PECVD process or an ALD process. Each of the holes 130 may extend through the first insulation layers 110 and the first sacrificial layers 120 in the first direction D1.

Due to the characteristics of a dry etch process, the holes 130 may be of a width that becomes gradually smaller from a top portion to a bottom portion thereof. That is, the widths of the holes 130 may gradually decrease, for example, as a taper, as depths of the holes 130 increase, respectively. Therefore, sidewalls of the holes 130 may have an acute angle with respect to the top surface of the substrate 100.

In example embodiments, the plurality of holes 130 may be arranged in the second and third directions D2 and D3, thereby defining a hole array. For example, the plurality of holes 130 may be arranged in a zigzagged pattern in the third direction D3, and thus additional holes 130 may be arranged in a given area as compared to other array patterns. Each of the holes 130 may be spaced apart from each other, such that upper portions of the holes 130 do not overlap each other.

Figure 6:
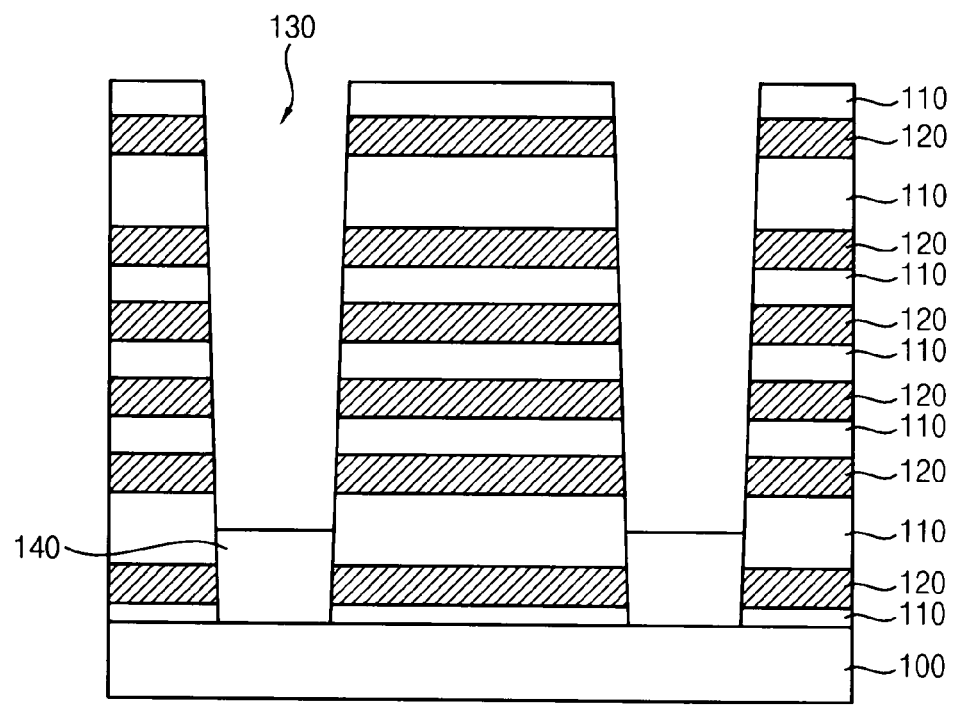
Figure 6:
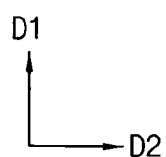

Referring to FIG. 6, a semiconductor pattern 140 may be formed that at least partially fills the hole 130.

In example embodiments, a selective epitaxial growth (SEG) process may be performed using the top surface of the substrate 100 exposed by the holes 130 as a seed to form the semiconductor pattern 140 partially filling the holes 130. The semiconductor pattern 140 may be formed to include a single crystalline silicon or single crystalline germanium according to the material of the substrate 100, and in some cases, impurities may be doped thereunto. Alternatively, an amorphous silicon layer may be formed to fill the holes 130, and a laser epitaxial growth (LEG) process or a solid phase epitaxial (SPE) process may be performed on the amorphous silicon layer to form the semiconductor pattern 140. In example embodiments, the semiconductor pattern 140 may be formed to have a top surface higher than that of the first sacrificial layer 120 at which a GSL 226 may be subsequently formed.

Figure 7:
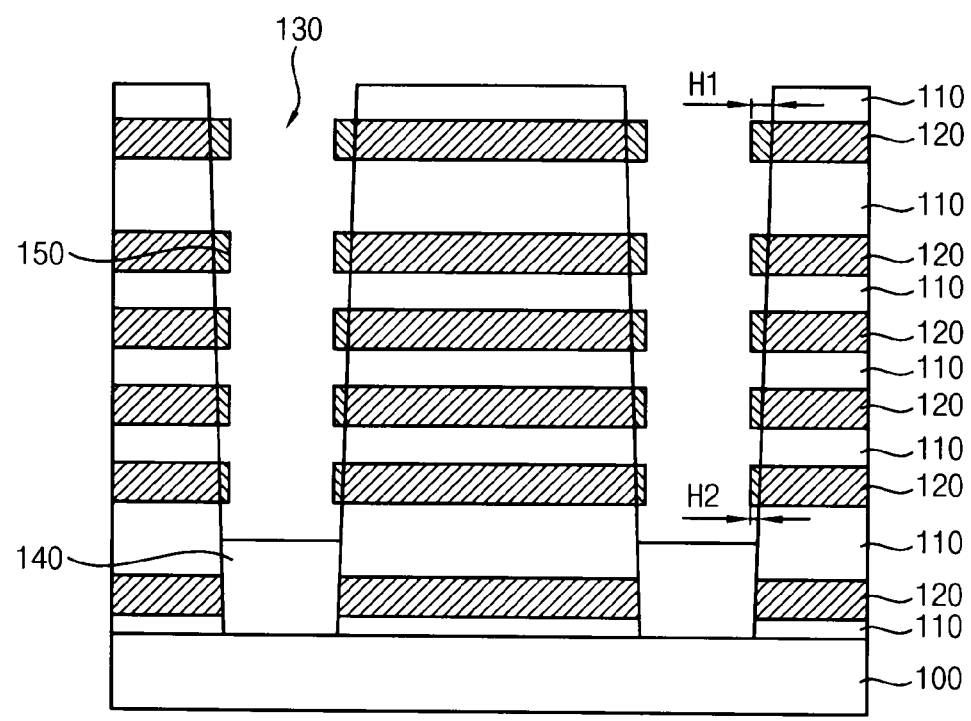
Figure 7:

Referring to FIG. 7 a second sacrificial layer pattern 150 may be formed by oxidizing the first sacrificial layer 120 exposed by the holes 130 according to a plasma treatment process.

In example embodiments, the plasma treatment process may be performed using an oxidizing gas and an inert gas. The oxidizing gas may include, but not be limited to, an oxygen gas ($O_2$), a nitrogen oxide gas (NO), a nitrous oxide gas ($N_2O$), an ozone gas ($O_3$), a water gas ($H_2O$), or a mixture thereof.

The plasma treatment process may oxidize portions of the first sacrificial layer 120 exposed by the holes 130, so that the oxidized portion may define the second sacrificial layer pattern 150. When, the first sacrificial layer 120 includes silicon nitride, the second sacrificial layer pattern 150 may include silicon oxide or silicon oxynitride. A volume of the oxidized portion may increase, so that the second sacrificial layer pattern 150 may project from the sidewalls of the holes 130 in a direction substantially parallel to the top surface of the substrate 100. Dimensions such as a height, width, surface area, or other dimensions of the second sacrificial layer pattern 150 from the sidewalls of the holes 130 may become gradually smaller from a top portion to a bottom portion, for example of the holes 130.

The plasma treatment process may have a relatively small step coverage. The step coverage may be defined as a ratio (H2/H1) between the first width, height, or related dimension H1 and the second width, height, or related dimension H2. A width, height, or related dimension of the second sacrificial layer pattern from an upper sidewall of the hole 130 may be defined as the first width, height, or related dimension H1, in particular, a distance in a direction D2 from a sidewall of an insulating layer 115 to a portion of a channel 170 at a top region of the device. Another width, height, or related dimension of the second sacrificial layer pattern from a lower sidewall of the hole 130 may be defined as the second width, height, or related dimension H2, in particular, a distance in the direction D2 from a sidewall of another insulating layer 115 to a portion of a channel 170 at a lower region of the device. When the first width, height, or related dimension H1 is substantially the same as the second width, height, or related dimension H2, the step coverage may be equal to about one. When the second width, height, or related dimension H2 is substantially equal to zero, the step coverage may be equal to about zero. That is, the step coverage may be in a range between zero and one.

As mentioned above, the holes 130 may be of a width that becomes gradually smaller from a top portion to a bottom portion thereof. When the step coverage is relatively small, the plasma treatment process may more effectively oxidize an upper portion of the hole 130 than a lower portion of the hole 130. Therefore, a variation of the widths of the holes 130 may be offset by the dimensions of the second sacrificial layer pattern 150. For example, the plasma treatment process may be adjusted, such that the step coverage may be below about 1/5. Accordingly, widths between the adjacent second sacrificial layer pattern 150 may be substantially the same at the upper portion and the lower portion of the hole 130.

In an example embodiment, the plasma treatment process may be performed by adjusting the process pressure. The process pressure may be one of the factors that may affect the step coverage.

If the plasma treat process is performed at a pressure above about 1 Torr, the step coverage may be above about 1/5. That is, the first sacrificial layer 120 at the lower portion of the hole 130 may be sufficiently oxidized, so that the variation of the width of the hole 130 may not be offset by the dimensions of the second sacrificial layer pattern 150.

In order to have the step coverage below about 1/5, the plasma treatment process may be performed at a pressure below about 1 Torr. Further, the plasma treatment process may be performed at a temperature below about 600° C.

According to example embodiments, the plasma treatment process may be performed after forming the semiconductor pattern 140. However, the present invention may not limited thereto. For example, the plasma treatment process may be performed before forming the semiconductor pattern 140.

Figure 8:
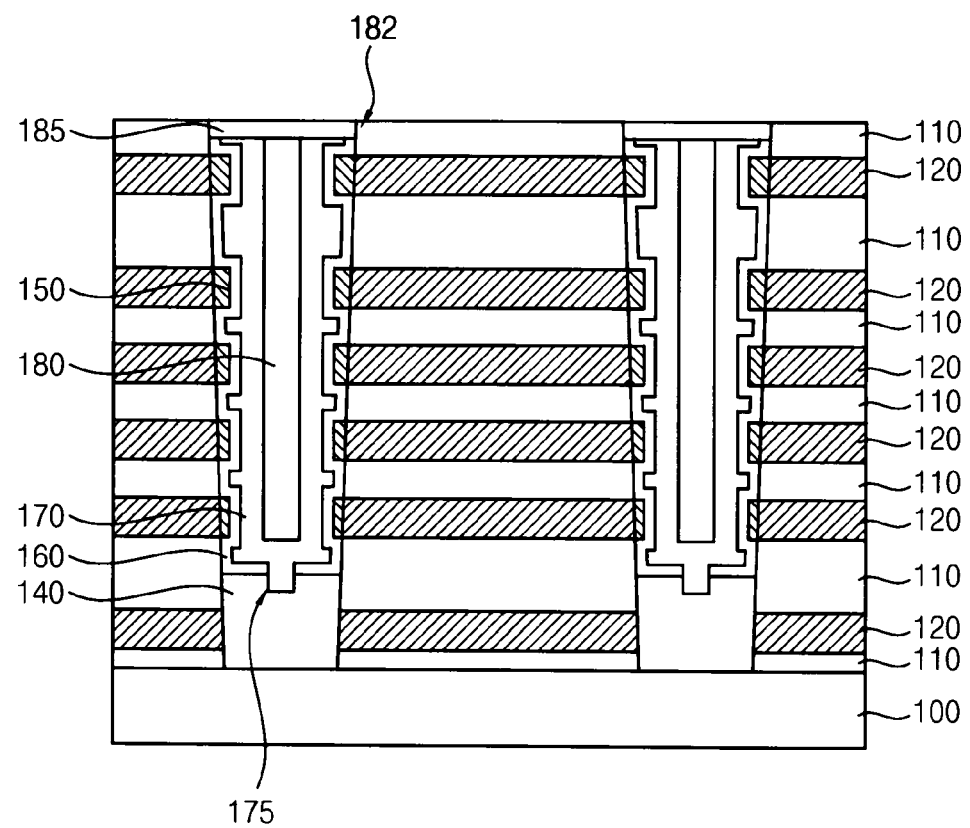
Figure 9:
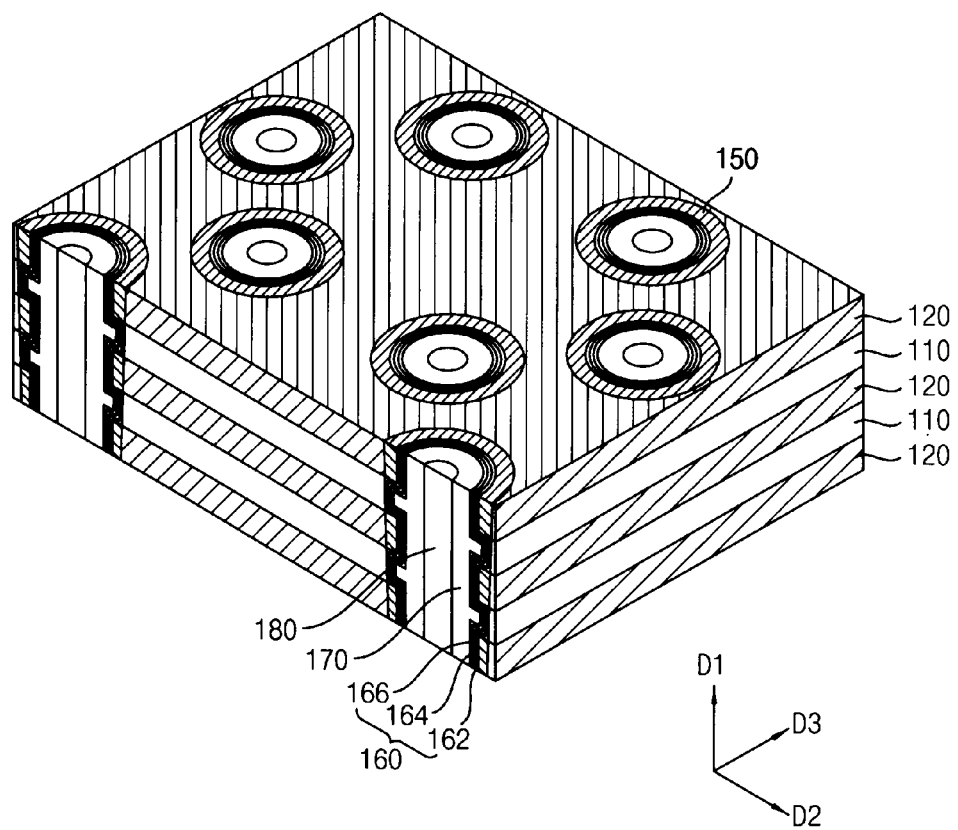

Referring to FIGS. 8 and 9, a charge storage structure 160, a channel 170, a second insulation layer pattern 180 and a pad 185 may be formed that fill the hole 130.

In example embodiments, a first blocking layer, a charge storage layer and a tunnel insulation layer, respectively, may be formed on inner walls of the holes 130, a top surface of the semiconductor pattern 140, the second sacrificial layer pattern 150 and the top surface of the uppermost first insulation layer 110, and lower portions of the first blocking layer, the charge storage layer and the tunnel insulation layer may be removed to form a first recess 175. A channel layer may be formed at inner walls of the first recess 175 of the hole 130. A second insulation layer may be formed to fill the hole 130. Upper portion of the channel layer and the second insulation layer may be planarized until the top surface of the uppermost first insulation layer 110 is exposed, thereby forming a first blocking layer pattern 162, a charge storage layer pattern 164, a tunnel insulation layer pattern 166, the channel 170 and the second insulation layer pattern 180, respectively. The first blocking layer pattern 162, the charge storage layer pattern 164, the tunnel insulation layer pattern 166 may constitute the charge storage structure 160.

In example embodiments, the charge storage structure 160 may cover the second sacrificial layer pattern 150. That is, the charge storage structure 160 may be formed on the sidewall of the hole 130 and on a sidewall of the second sacrificial layer pattern 150. As mentioned above, a variation of the width of the hole 130 may be offset by the dimensions of the second sacrificial layer pattern 150, so that the charge storage structure 160 may have uniform size adjacent the second sacrificial layer pattern 150.

In example embodiments, the first blocking layer may be formed using an oxide, e.g., silicon oxide, the charge storage layer may be formed using a nitride, e.g., silicon nitride, and the tunnel insulation layer may be formed using an oxide, e.g., silicon oxide.

Subsequently, upper portions of the channel 170, the charge storage structure 160, and the second insulation layer pattern 180 may be removed by an etch back process to form the second recess 182. A pad layer may be formed on the channel 170, the charge storage structure 160, the second insulation layer pattern 180, the isolation layer pattern 150 and the uppermost first insulation layer 110 to fill the second recess 182. The pad layer may be planarized until a top surface of the uppermost first insulation layer 110 is exposed to form the pad 185.

Figure 10:
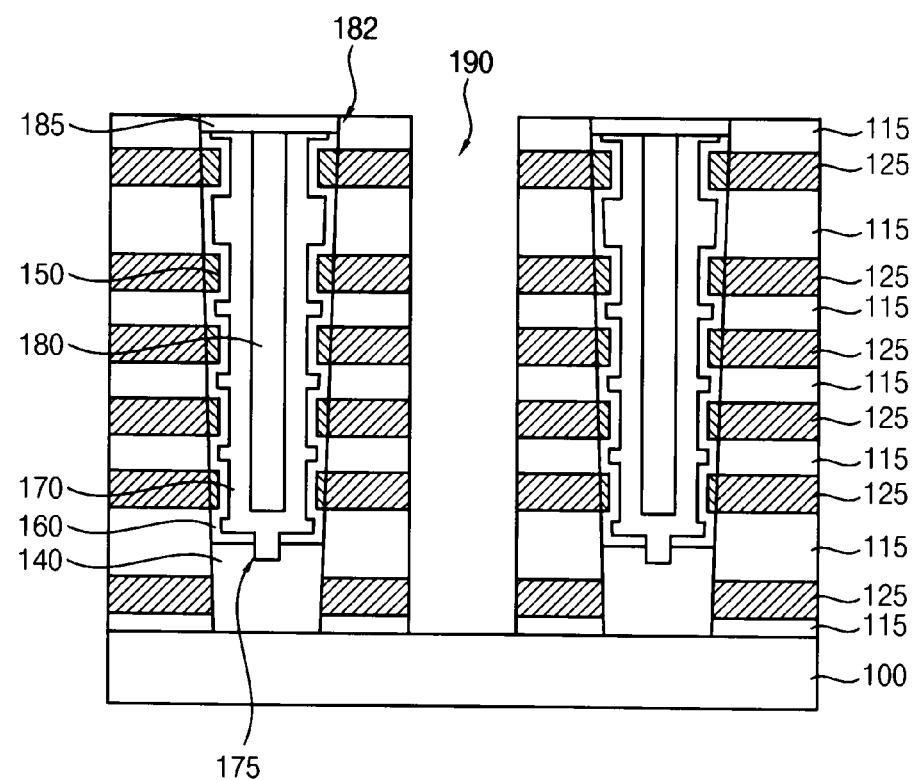

Referring to FIG. 10, a first opening 190 may be formed through the first insulation layers 110 and the first sacrificial layers 120 to expose the top surface of the substrate 100.

In example embodiments, after forming a hard mask (not shown) on the uppermost first insulation layer 110, the insulation layers 110 and the first sacrificial layers 120 may be, for example, dry etched using the hard mask as an etch mask to form the first opening 190. The first opening 190 may extend along the first direction D1. In example embodiments, a plurality of first openings 190 may be arranged in the second direction D2, and each first opening 190 may extend in the third direction D3.

The first insulation layer 110 and the first sacrificial layer 120 may form a first insulation layer pattern 115 and a first sacrificial layer pattern 125, respectively. A plurality of first insulation layer patterns 115 may be formed in the second direction D2 at each level, and each first insulation layer pattern 115 may extend in the third direction D3.

Figure 11:
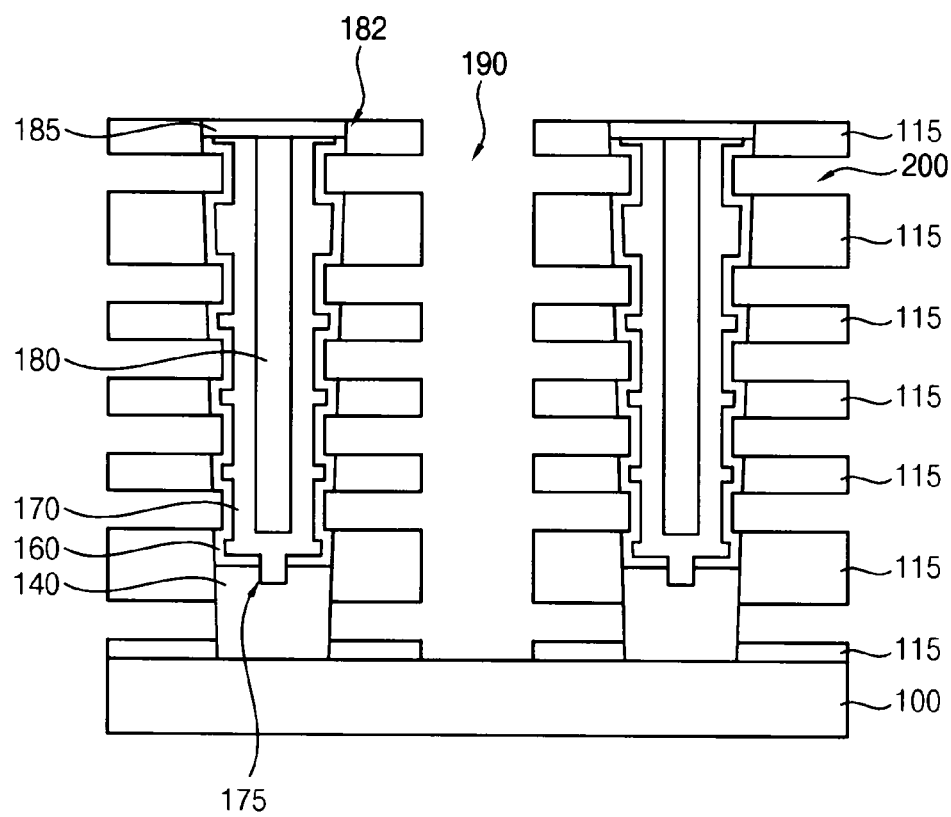
Figure 11:
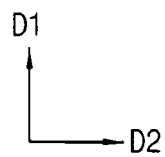

Referring to FIG. 11, the first sacrificial layer patterns 125 and the second sacrificial layer patterns 150 may be removed to form a gap 200 between first insulation layer patterns 115 at adjacent levels.

In example embodiments, the second sacrificial layer patterns 150 and the first sacrificial layer patterns 125 exposed by the first openings 190 may be removed by, for example, a wet etch process using an etch solution including phosphoric acid and/or sulfuric acid. An outer sidewall of the first blocking layer pattern 162 may be partially exposed by the gap 200.

Referring to FIG. 12, a second blocking layer and a gate electrode layer may be sequentially formed on the exposed portion of the outer sidewall of the first blocking layer pattern 162, an inner wall of the gap 200, a surface of the first insulation pattern 115, the exposed top surface of the substrate 100 and a top surface of the pad 185. The gate electrode layer may be partially removed to form a plurality of gate electrodes 222, 224 and 226, respectively, in the gap 200.

In an example embodiment, the second blocking layer may be formed using an insulation material such as aluminum oxide or silicon oxide by applying a sequentially flow deposition (SFD) process or an atomic layer deposition (ALD) process, or related process known to those of ordinary skill in the art.

In example embodiments, the gate electrode layer may be formed using a metal. For example, the gate electrode layer may be formed to include a metal of a low resistance, e.g., tungsten, titanium, tantalum, platinum, and the like. When the gate electrode layer is formed to include tungsten, the gate electrode layer may be formed by a CVD process or an ALD process using tungsten hexafluoride ($WF_6$) as a source gas. Since the plurality of holes 130 are preferably spaced apart from each other, an undesirable void may not be formed in the gate electrode layer.

Subsequently, the gate electrode layer may be partially removed by, for example, performing a wet etch process. In example embodiments, the plurality of gate electrodes 222, 224 and 226 may fill the gap 200. The gate electrodes 222, 224 and 226 may extend along the third direction D3.

The plurality of gate electrodes 222, 224 and 226 may include a GSL 226, a word line 222 and a SSL 224, sequentially, with respect to the top surface of the substrate 100. Each of the GSL 226, the word line 222 and the SSL 224 may be formed at a single level or at a plurality of levels. According to at least one example embodiment, each of the GSL 226 and the SSL 224 may be formed at single level, and the word line 222 may be formed at four levels between the GSL 226 and the SSL 217, but is not limited thereto.

When the gate electrode layer is partially removed in this manner, portions of the second blocking layer on a surface of the first insulation layer pattern 115 and on top surfaces of the substrate 100 and the pad 185 may also be removed, thereby forming a second blocking layer pattern 210.

In some embodiments, the channel 170, the charge storage structure 160, more specifically, the tunnel insulation layer pattern 166, the charge storage layer pattern 164 and the first blocking layer pattern 162, the second blocking layer pattern 210 and the word line 222 may constitute a memory cell. The charge storage structures 160 may have uniform size adjacent to the gate electrodes 222 and 224, so that a dispersion of electrical characteristics of the memory cells of the vertical memory devices may be improved.

In a process that includes partially removing the gate electrode layer and the second blocking layer, the first opening 190 exposing the top surface of the substrate 100 and extending in the third direction D3 may be formed again. Impurities may be implanted into the exposed top surface of the substrate 100 to form an impurity region 105. In example embodiments, the impurities may include n-type impurities, for example, phosphorus and/or arsenic. In example embodiments, the impurity region 105 may extend in the third direction D3 and may serve as a common source line (CSL).

Figure 13:
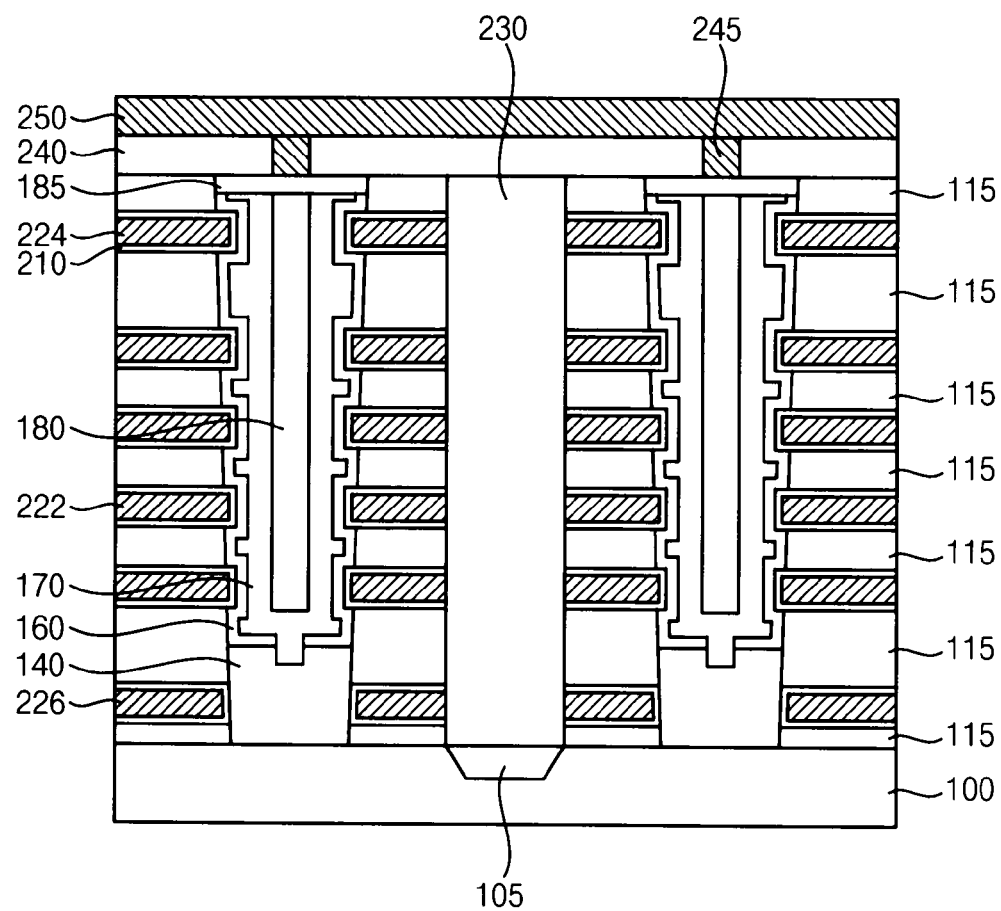

Referring to FIG. 13, a third insulation pattern 230 may be formed to fill the first opening 190. A bit line contact 245 may be formed to be electrically connected to a bit line 250.

In example embodiments, a third insulating interlayer fills the first opening 190 and is formed on the substrate 100 and at least a portion of the uppermost the first insulation pattern 115. An upper portion of the third insulating interlayer may be planarized until a top surface of the uppermost first insulation layer pattern 115 is exposed to form the third insulation layer pattern 230.

A fourth insulation layer 240 may be formed on the first insulation layer pattern 115, the third insulation layer pattern 230, and the pad 185, respectively. A second opening may be formed to expose a top surface of the pad 185. The bit line contact 245 may be formed on the pad 185 to fill the second opening. The bit line 250 electrically connected to the bit line contact 245 may be formed to complete the formation of the vertical memory device. In example embodiments, the bit line 250 may extend in the second direction D2, and a plurality of bit lines 250 may be formed in the third direction D3.

According to example embodiments, a plasma treatment process having a relatively low step coverage may be performed to form the second sacrificial layer patterns 150. A variation of the widths of the holes 130 may be offset by the dimensions, e.g., heights, of the second sacrificial layer pattern 150. Therefore, the charge storage structure 160 may have a uniform size.

Figure 14:
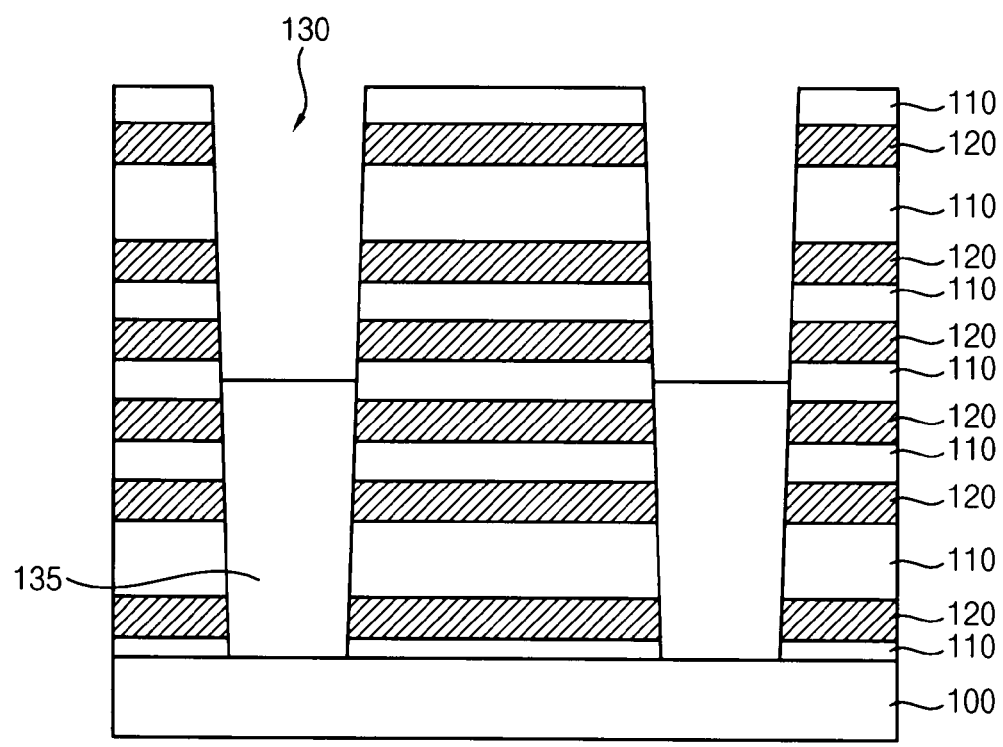
FIGS. 14 to 16 are cross-sectional views illustrating a method of manufacturing a vertical memory device in accordance with another example embodiment.
Figure 15:
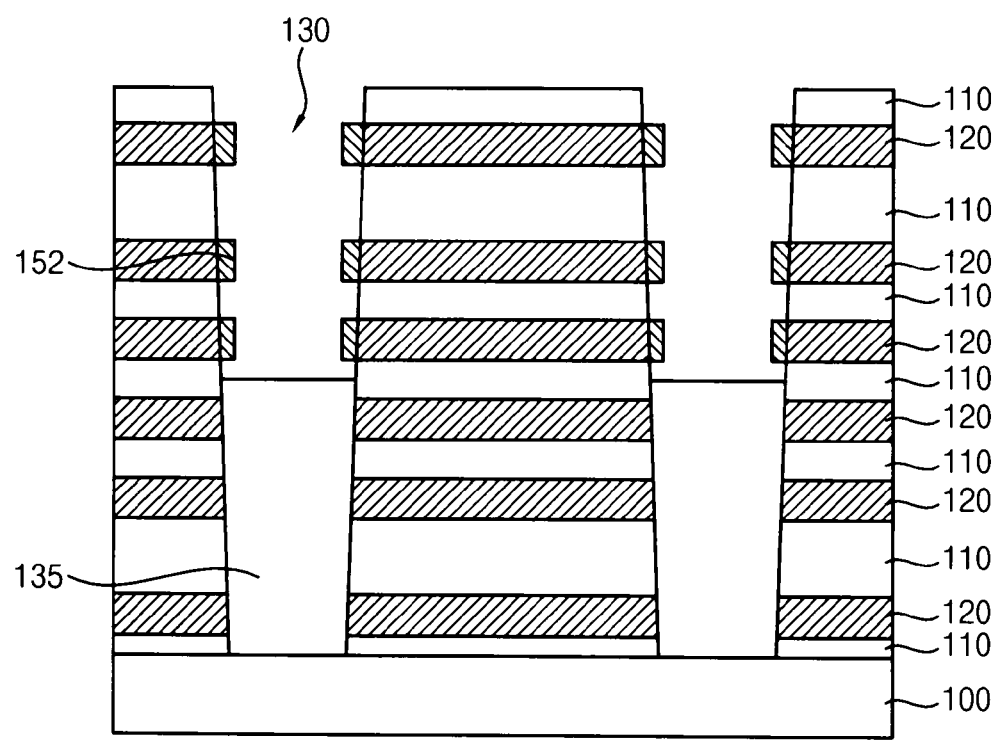
Figure 15:
Figure 16:
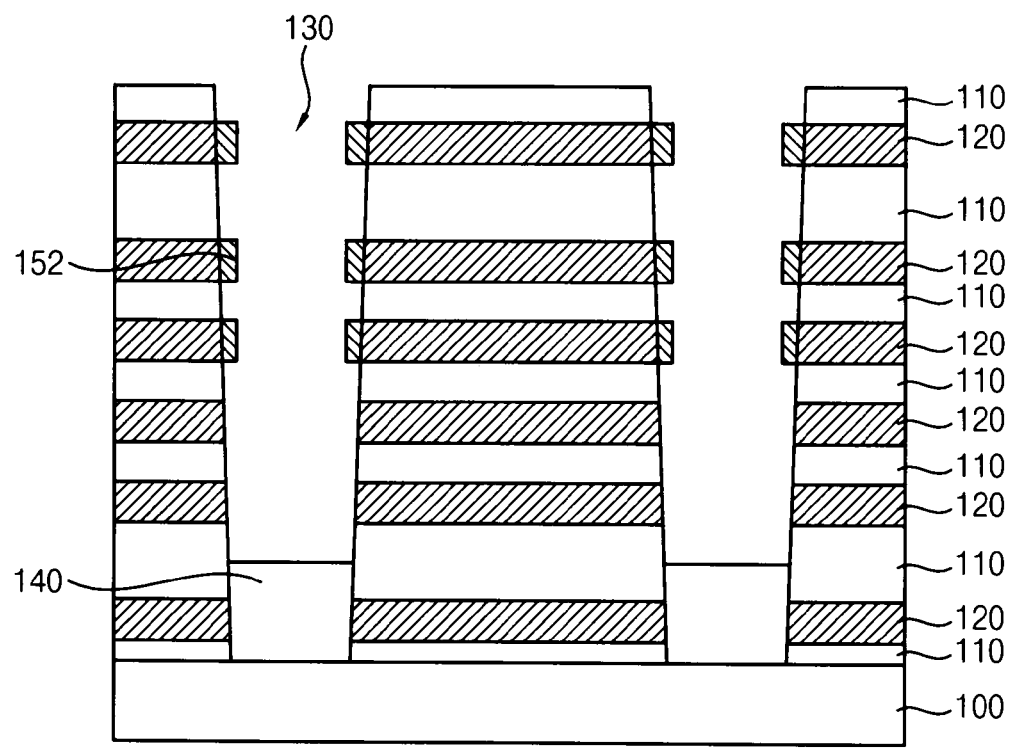

FIGS. 14 to 16 are cross-sectional views illustrating a method of manufacturing a vertical memory device in accordance with another example embodiment.

Processes substantially the same as or similar to those illustrated with reference to FIGS. 4 and 5 may be performed. That is, similar to other embodiments described herein, a plurality of first insulation layers 110 and a plurality of first sacrificial layers 120 may be alternately and repeatedly formed on a substrate 100. A plurality of holes 130 may be formed through the first insulation layers 110 and the first sacrificial layers 120 to expose the top surface of the substrate 100.

Referring to FIG. 14, a preliminary semiconductor pattern 135 may be formed to partially fill the hole 130. In example embodiments, a selective epitaxial growth (SEG) process may be performed using the top surface of the substrate 100 exposed by the holes 130 as a seed to form a preliminary semiconductor pattern 135 partially filling the holes 130.

In example embodiments, the preliminary semiconductor pattern 135 may be formed to have a top surface higher than that of some first sacrificial layer 120 at which the word line 222 may be formed subsequently, for example, illustrated at FIG. 12. Further, the preliminary semiconductor pattern 135 may be formed to have a top surface lower than that of the first sacrificial layer 120 in which the SSL 224 may be formed subsequently. That is, the preliminary semiconductor pattern 135 may cover sidewalls of some first sacrificial layer 120 in which the word line 222 may be subsequently formed.

Referring to FIG. 15, a second sacrificial layer pattern 152 may be formed between the first insulation layers 110 by oxidizing the first sacrificial layer 120 exposed by the holes 130 according to a plasma treatment process. The plasma treatment process may be substantially the same as or similar to a plasma treatment process described with reference to FIG. 7. A portion of the second sacrificial layer pattern 152 may project from the sidewalls of the holes 130 in a direction substantially parallel to the top surface of the substrate 100. The widths of the second sacrificial layer patterns 152 from the sidewalls of the holes 130 may become gradually smaller from a top portion to a bottom portion of the holes 130.

On the other hand, the first sacrificial layer 120 covered by the preliminary semiconductor pattern 135 may not be oxidized by the plasma treatment process. That is, the first sacrificial layer 120 may be selectively oxidized by adjusting the height of the preliminary semiconductor pattern 135. Therefore, a variation of the width of the hole 130 may be effectively offset by the dimensions of the second sacrificial layer patterns 152.

Referring to FIG. 16, the preliminary semiconductor pattern 135 may be partially removed by an etch back process, thereby forming a semiconductor pattern 140. In example embodiments, the semiconductor pattern 140 may be formed to have a top surface higher than that of the first sacrificial layer 120 at which the GSL 226 may be formed.

Processes substantially the same as or similar to those illustrated with reference to FIGS. 8 to 13 may additionally or alternatively be performed to manufacture the vertical memory device.

According to example embodiments, a plasma treatment process having a relatively low step coverage may be performed to form one or more second sacrificial layer patterns 152. A variation of the widths of the holes 130 may be offset by the dimensions of the second sacrificial layer patterns 152. Therefore, the charge storage structure 160 may have a uniform size. Further, the first sacrificial layer may be selectively oxidized by adjusting a height of the preliminary semiconductor pattern 135.

Figure 17:
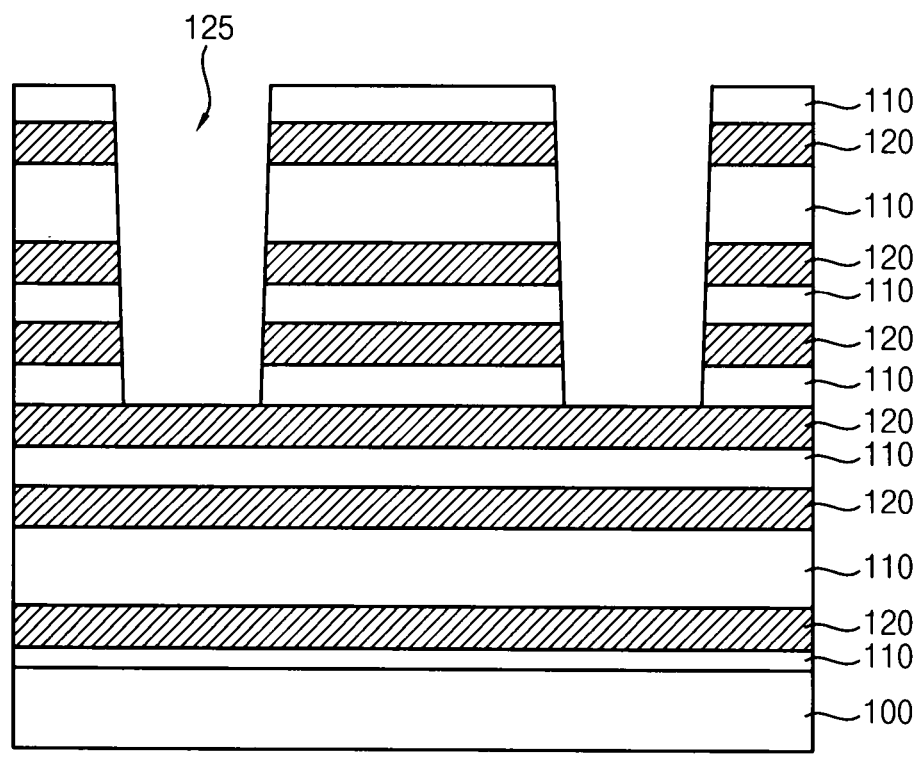
FIGS. 17 to 19 are cross-sectional views illustrating a method of manufacturing a vertical memory device in accordance with another example embodiment.
Figure 17:
Figure 18:
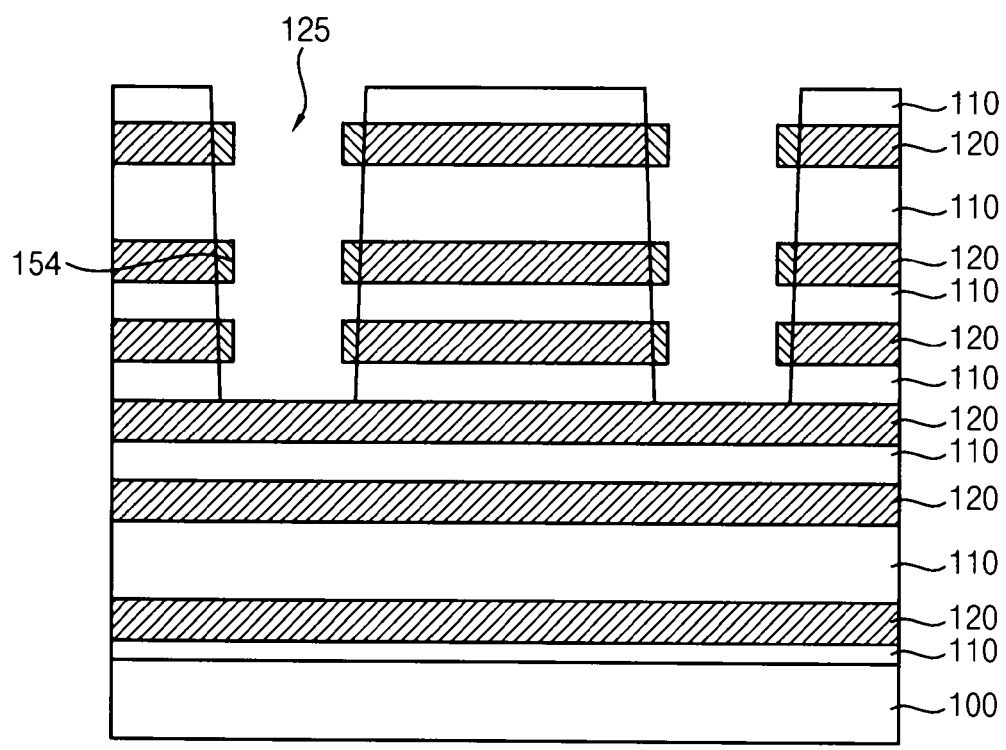
Figure 19:
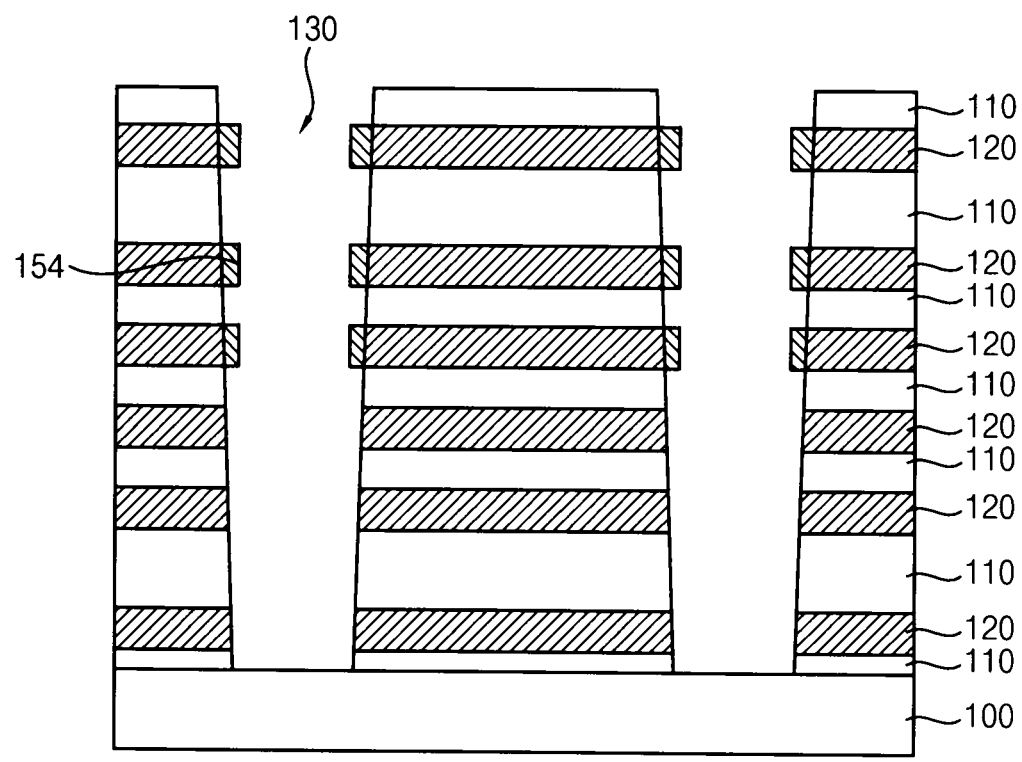
Figure 19:
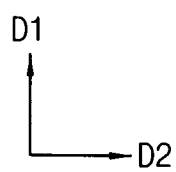

FIGS. 17 to 19 are cross-sectional views illustrating a method of manufacturing a vertical memory device in accordance with another example embodiment.

Processes substantially the same as or similar to those illustrated with reference to FIG. 4 may be performed. That is, a plurality of first insulation layers 110 and a plurality of first sacrificial layers 120 may be alternately and repeatedly formed on a substrate 100.

Referring to FIG. 17, a plurality of preliminary holes 125 may be formed by partially removing at least some portions the first insulation layers 110 and the first sacrificial layers 120. The preliminary holes 125 may have a planar shape and an arrangement which may be substantially the same as or similar to those of the holes 130 described with reference to FIG. 3. However, the preliminary holes 125 may not pass through most of the first insulation layers 110 and the first sacrificial layers 120. Thus, the preliminary holes 125 may not expose a top surface of the substrate 100, and may instead expose a top surface of a first sacrificial layer 120. However, the present invention may not be limited thereto. For example, the preliminary holes 125 may expose a top surface of a first insulation layer 110 instead of a first sacrificial layer 120.

Referring to FIG. 18, a second sacrificial layer pattern 154 may be formed by oxidizing the first sacrificial layer 120 exposed by the preliminary holes 125 through a plasma treatment process. The plasma treatment process may be substantially the same as or similar to the plasma treatment process described with reference to other embodiments described herein, for example, illustrated and described with respect to FIG. 7. The second sacrificial layer pattern 154 may project from sidewalls of the preliminary holes 125 in a direction substantially parallel to the top surface of the substrate 100. The width, height, or related dimension of the second sacrificial layer patterns 154 from the sidewalls of the preliminary holes 125 may become gradually smaller from a top portion to a bottom portion of the preliminary holes 125.

Referring to FIG. 19, a plurality of holes 130 may be formed through the first insulation layers 110 and the first sacrificial layers 120 to expose the top surface of the substrate 100. That is, the first insulation layers 110 and the first sacrificial layers 120 under the preliminary holes 125 may be removed to form the plurality of holes 130.

Then, a semiconductor pattern may be formed to partially fill the holes 130, and processes substantially the same as or similar to those illustrated with reference to FIGS. 8 to 13 may be performed to manufacture the vertical memory device.

According to example embodiments, a plasma treatment process having a relatively low step coverage may be performed to form one or more second sacrificial layer patterns 154. A variation of the widths of the holes 130 may be offset by the dimensions, for example, widths or heights, of the second sacrificial layer pattern 154. Therefore, the charge storage structure 160 may have a uniform size. Further, the first sacrificial layer 120 may be selectively oxidized by adjusting the heights of the preliminary holes 125.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method for manufacturing a vertical memory device, the method comprising:
    alternately stacking a plurality of insulation layers and a plurality of first sacrificial layers on a substrate;
    forming a plurality of holes through the plurality of insulation layers and first sacrificial layers;
    performing a plasma treatment process to oxidize the first sacrificial layers exposed by the holes;
    forming a plurality of second sacrificial layer patterns projecting from sidewalls of the holes in response to performing the plasma treatment process;
    forming a blocking layer pattern, a charge storage layer pattern and a tunnel insulation layer pattern on the sidewall of the holes that cover the second sacrificial layer patterns;
    forming a plurality of channels to fill the holes;
    removing the first sacrificial layers and the second sacrificial layer patterns to form a plurality of gaps exposing a sidewall of the blocking layer pattern; and
    forming a plurality of gate electrodes to fill the gaps.

2. The method of claim 1, wherein portions of the second sacrificial layer patterns extending from the sidewalls of the holes have different widths relative to each other.

3. The method of claim 2, wherein the widths of the second sacrificial layer pattern portions become gradually smaller from a top portion to a bottom portion of the holes.

4. The method of claim 3, wherein a ratio between a first width of the second sacrificial layer pattern closest to the substrate and a second width of the second sacrificial layer pattern farmost from the substrate is smaller than about 1/5.

5. The method of claim 3, wherein the plasma treatment process is performed at a pressure below about 1 Torr.

6. The method of claim 1, wherein the plasma treatment process uses an oxygen gas, a nitrogen oxide gas, a nitrous oxide gas, an ozone gas, a water gas or a mixture thereof.

7. The method of claim 1, further comprising forming a semiconductor pattern partially filling the holes, before performing the plasma treatment process.

8. The method of claim 1, further comprising:
    forming a preliminary semiconductor pattern that at least partially fills the holes, before performing the plasma treatment process; and
    partially removing the preliminary semiconductor pattern to form a semiconductor pattern, after performing the plasma treatment process.

9. A method of manufacturing a vertical memory device, the method comprising:
    alternately stacking a plurality of insulation layers and a plurality of first sacrificial layers on a substrate;
    partially removing the insulation layers and the first sacrificial layers to form a plurality of preliminary holes;
    performing a plasma treatment process to oxidize the first sacrificial layers exposed by the preliminary holes;
    forming a plurality of second sacrificial layer patterns projecting from sidewalls of the preliminary holes in response to performing the plasma treatment process;
    partially removing the insulation layers and the first sacrificial layers under the preliminary holes to form a plurality of holes;
    forming a blocking layer pattern, a charge storage layer pattern and a tunnel insulation layer pattern on the sidewall of the holes that cover the second sacrificial layer patterns;
    forming a plurality of channels to fill the holes;
    removing the first sacrificial layer and the second sacrificial layer patterns to form a plurality of gaps exposing a sidewall of the blocking layer pattern; and
    forming a plurality of gate electrodes to fill the gaps.

10. The method of claim 9, wherein the widths of the second sacrificial layer patterns becomes gradually smaller from a top portion to a bottom portion of the preliminary holes.

11. The method of claim 10, wherein a ratio between a first width of the second sacrificial layer pattern closest to the substrate and a second width of the second sacrificial layer pattern farmost from the substrate is smaller than about 1/5.

12. A method for forming a vertical memory device, the method comprising:
    alternately stacking a plurality of insulation layers and a plurality of first sacrificial layers on a substrate;
    forming a plurality of holes through the plurality of insulation layers and first sacrificial layers;
    forming a plurality of second sacrificial layer patterns, wherein portions of the second sacrificial layer patterns project from sidewalls of the holes;
    forming a charge storing structure at the holes;
    removing the first sacrificial layers and the second sacrificial layer patterns to form a plurality of gaps exposing a sidewall of the charge storing structure; and
    forming a plurality of gate electrodes to fill the gaps, wherein a variation of widths of the holes are offset by widths of the portions of the second sacrificial layer pattern projecting the sidewalls of the holes.

13. The method of claim 12, wherein forming the second sacrificial layer patterns comprises:
    performing a plasma treatment process to oxidize the first sacrificial layers exposed by the holes.

14. The method of claim 12, wherein portions of the second sacrificial layer patterns extending from the sidewalls of the holes have different widths relative to each other.

15. The method of claim 14, wherein the widths of the second sacrificial layer pattern portions become gradually smaller from a top portion to a bottom portion of the holes.

16. The method of claim 12, wherein a ratio between a first width of the second sacrificial layer pattern closest to the substrate and a second width of the second sacrificial layer pattern farmost from the substrate is smaller than about 1/5.

* * * * *